(12) United States Patent
Yang et al.

(10) Patent No.: US 12,051,628 B2
(45) Date of Patent: Jul. 30, 2024

(54) SEMICONDUCTOR DEVICE WITH FUNNEL SHAPE SPACER AND METHODS OF FORMING THE SAME

(71) Applicant: Taiwan Semiconductor Manufacturing Co., Ltd., Hsin-Chu (TW)

(72) Inventors: Cheng-Yu Yang, Changhua County (TW); Yen-Ting Chen, Hsinchu (TW); Wei-Yang Lee, Taipei (TW); Fu-Kai Yang, Hsinchu (TW); Yen-Ming Chen, Hsin-Chu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/977,405

(22) Filed: Oct. 31, 2022

(65) Prior Publication Data

US 2023/0052380 A1    Feb. 16, 2023

Related U.S. Application Data

(63) Continuation of application No. 17/122,535, filed on Dec. 15, 2020, now Pat. No. 11,488,874, which is a
(Continued)

(51) Int. Cl.
*H01L 21/8234* (2006.01)
*H01L 21/033* (2006.01)
(Continued)

(52) U.S. Cl.
CPC .. *H01L 21/823468* (2013.01); *H01L 21/0337* (2013.01); *H01L 21/823431* (2013.01); *H01L 21/823437* (2013.01); *H01L 21/823475* (2013.01); *H01L 21/823864* (2013.01); *H01L 27/0886* (2013.01); *H01L 29/0649* (2013.01);
(Continued)

(58) Field of Classification Search
CPC .......... H01L 21/0337; H01L 21/28114; H01L 21/28247; H01L 21/31116; H01L 21/32136; H01L 21/76897; H01L 21/823431; H01L 21/823437; H01L 21/823468; H01L 21/823475; H01L 21/823864; H01L 27/088; H01L 27/0886; H01L 29/0649; H01L 29/6653; H01L 29/66545; H01L 29/66553; H01L 29/6656;
(Continued)

(56) References Cited

U.S. PATENT DOCUMENTS

| | | |
|---|---|---|
| 2007/0111427 A1 | 5/2007 | Yamashita et al. |
| 2011/0284935 A1 | 11/2011 | Yamada |
| 2021/0143069 A1 | 5/2021 | Yang et al. |

*Primary Examiner* — Cheung Lee
(74) *Attorney, Agent, or Firm* — HAYNES AND BOONE, LLP

(57) ABSTRACT

Semiconductor device and the manufacturing method thereof are disclosed herein. An exemplary semiconductor device comprises a substrate, at least two gate structures disposed over the substrate, each of the at least two gate structures including a gate electrode and a spacer disposed along sidewalls of the gate electrode, wherein the spacer includes a refill portion and a bottom portion, the refill portion of the spacer has a funnel shape such that a top surface of the refill portion of the spacer is larger than a bottom surface of the refill portion of the spacer, and a source/drain contact disposed over the substrate and between the spacers of the at least two gate structures.

20 Claims, 5 Drawing Sheets

Related U.S. Application Data continuation of application No. 16/442,986, filed on Jun. 17, 2019, now Pat. No. 10,867,870.

(51) Int. Cl.
*H01L 21/8238* (2006.01)
*H01L 27/088* (2006.01)
*H01L 29/06* (2006.01)
*H01L 29/66* (2006.01)
*H01L 29/78* (2006.01)

(52) U.S. Cl.
CPC .... *H01L 29/6653* (2013.01); *H01L 29/66545* (2013.01); *H01L 29/66553* (2013.01); *H01L 29/6656* (2013.01); *H01L 29/66795* (2013.01); *H01L 29/785* (2013.01)

(58) Field of Classification Search
CPC ............. H01L 29/66795; H01L 29/785; H01L 29/42376
See application file for complete search history.

SEMICONDUCTOR DEVICE WITH FUNNEL SHAPE SPACER AND METHODS OF FORMING THE SAME

PRIORITY DATA

The present application is a continuation application of U.S. patent application Ser. No. 17/122,535, filed Dec. 15, 2020, which is a continuation application of U.S. patent application Ser. No. 16/442,986, filed Jun. 17, 2019, each of which is herein incorporated by reference in its entirety.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also increased the complexity of processing and manufacturing ICs and, for these advances to be realized, similar developments in IC processing and manufacturing are needed. For example, it has been observed that a shorter path between the metal gate and the source/drain (S/D) contact may be induced due to the hard mask overlay shifting during the formation the S/D contact and the tilting profile of the S/D contact (a top surface of the S/D contact is larger than a bottom surface of the S/D contact). Current leakage may occur due to the shorter path which may induce lower yield during circuit probing and thus decrease the performance of the semiconductor device. Accordingly, improvements are needed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
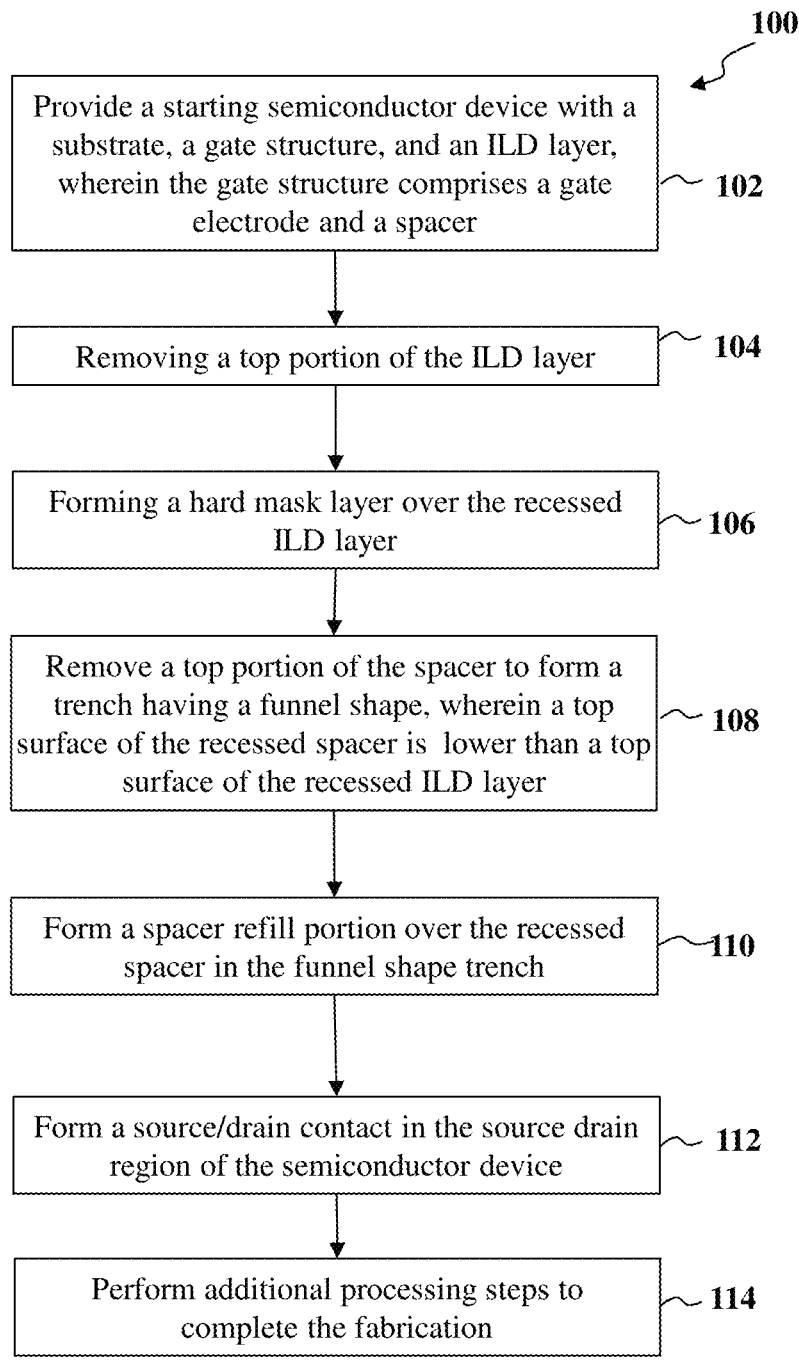
FIG. 1 illustrates a flowchart of an example method for making a semiconductor device in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and the fabrication thereof. Due to the scaling down of the semiconductor device, the geometry size between different components of the semiconductor device is getting smaller and smaller which may cause some issues and decrease the performance of the semiconductor device. For example, in a conventional fabrication, due to the hard mask overlay shifting and/or fabrication deviation, the space between the metal gate and the S/D contact may be very small, especially between the top portions of the metal gate and the S/D contact since the S/D contact may have a funnel/tilting profile with a larger top portion and a smaller bottom portion. When the space between the metal gate and the S/D contact is too small, a current leakage may occur therebetween which may induce low yield and damage the performance of the semiconductor device.

The present disclosure provides a funnel shape spacer between the metal gate and the S/D contact to provide a safe space between the metal gate and the S/D contact (especially at the top portion) so that no current leakage will occur during the operation and the performance of the semiconductor device can be improved. Of course, these advantages are merely exemplary, and no particular advantage is required for any particular embodiment.

Figure 2:
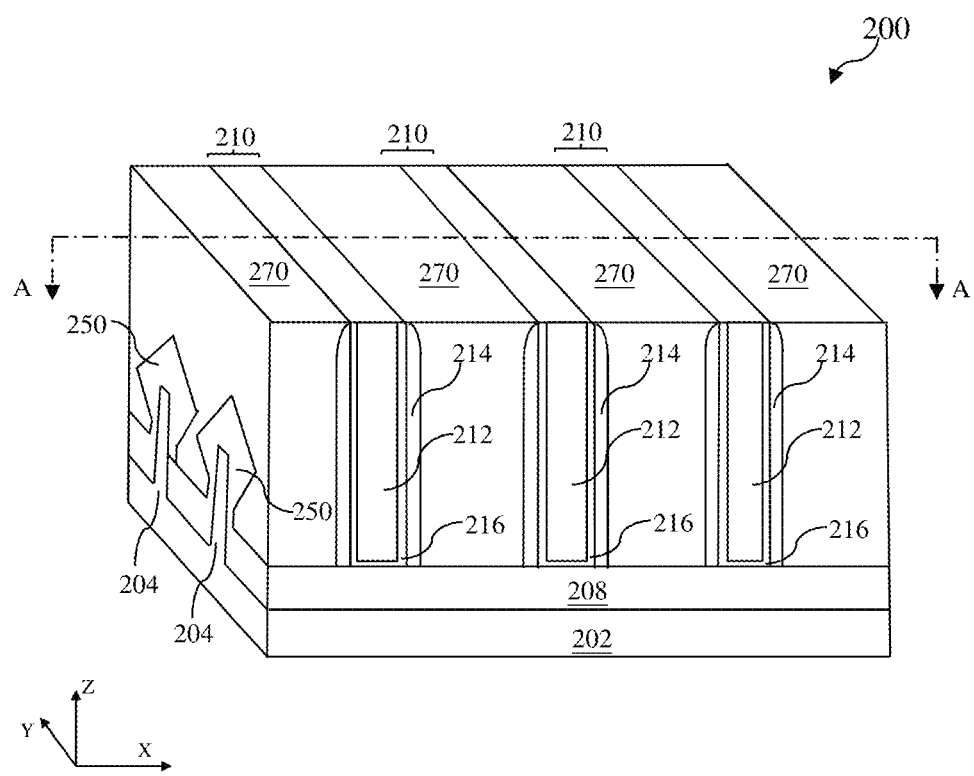
FIG. 2 illustrates a three-dimensional perspective view of an example semiconductor device in accordance with some embodiments of the present disclosure.

FIG. 1 illustrates a flow chart of a method 100 for forming a semiconductor device 200 (hereafter called "device 200" in short) in accordance with some embodiments of the present disclosure. Method 100 is merely an example and is not intended to limit the present disclosure beyond what is explicitly recited in the claims. Additional operations can be performed before, during, and after method 100, and some operations described can be replaced, eliminated, or moved around for additional embodiments of the method. Method 100 is described below in conjunction with other figures, which illustrate various three-dimensional and cross-sectional views of device 200 during intermediate steps of method 100. In particular, FIG. 2 illustrates a three-dimensional view of device 200. FIGS. 3-11 illustrate cross-sectional views of device 200 taken along plane A-A shown in FIG. 2 (that is, along an X-direction).

Device 200 may be an intermediate device fabricated during processing of an integrated circuit (IC), or a portion thereof, that may comprise static random-access memory (SRAM) and/or other logic circuits, passive components such as resistors, capacitors, and inductors, and active components such as p-type FETs (PFETs), n-type FETs (NFETs), fin-like FETs (FinFETs), metal-oxide semiconductor field effect transistors (MOSFET), complementary metal-oxide semiconductor (CMOS) transistors, bipolar transistors, high voltage transistors, high frequency transistors, and/or other memory cells. Device 200 can be a portion of a core region (often referred to as a logic region), a memory region (such as a static random access memory (SRAM) region), an analog region, a peripheral region (often referred to as an input/output (I/O) region), a dummy region, other suitable region, or combinations thereof, of an integrated circuit (IC). In some embodiments, device 200 may be a portion of an IC chip, a system on chip (SoC), or portion thereof. The present disclosure is not limited to any particular number of devices or device regions, or to any particular device configurations. For example, though device 200 as illustrated is a three-dimensional FET device (e.g., a FinFET), the present disclosure may also provide embodiments for fabricating planar FET devices.

Referring to FIGS. 1 and 2, at operation 102, method 100 provides a semiconductor device 200 comprising one or more gate structures 210. Semiconductor device 200 may also include one or more fins 204 protruding from a substrate 202 and separated by an isolation structure 208. One or more gate structures 210 disposed over substrate 202 and fins 204. Gate structures 210 defines a channel region (covered by gate structures 210), a source region and a drain region of fins 204. Gate structures 210 may include gate electrodes 212 and gate spacers 214 disposed along sidewalls of gate electrodes 212. Gate structures 210 may include other components such as one or more gate dielectric layers 216 disposed over isolation structure 208 and below gate electrodes 212 and/or between gate electrodes 212 and gate spacers 214, a barrier layers, a glue layer, a capping layer, other suitable layers, or combinations thereof. Various gate hard mask layers may be disposed over gate electrodes 212 and may be considered a part of the gate structures 210. Device 200 may also include S/D features 250 epitaxially grown over S/D regions of fins 204. Device 200 may also include interlayer dielectric (ILD) layer 270 disposed over substrate 202 and fins 204 and between gate structures 210. It is understood components included in device 200 are not limited to the numbers and configurations as shown in FIG. 2. More or less components, for example, more or less fins and gate structures, may be included in device 200. In some other embodiments, device 200 may be a metal-oxide-semiconductor field-effect transistor (MOSFET) device without fin structures.

In the depicted embodiment of FIG. 2, device 200 comprises a substrate (wafer) 202. In the depicted embodiment, substrate 202 is a bulk substrate that includes silicon. Alternatively or additionally, the bulk substrate includes another elementary semiconductor, a compound semiconductor, an alloy semiconductor, or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 202 may include various doped regions. In some embodiments, substrate 202 includes n-type doped regions (for example, n-type wells) doped with n-type dopants, such as phosphorus (for example, $^{31}P$), arsenic, other n-type dopant, or combinations thereof. In some embodiments, substrate 202 includes p-type doped region (for example, p-type wells) doped with p-type dopants, such as boron (for example, $^{11}B$, BF2), indium, other p-type dopant, or combinations thereof. An ion implantation process, a diffusion process, and/or other suitable doping process can be performed to form the various doped regions.

Semiconductor fins 204 are formed over substrate 202. Each fin 204 may be suitable for providing an n-type FET or a p-type FET. Fins 204 are oriented substantially parallel to one another. Each of fins 204 has at least one channel region and at least one source region and drain region (both refer to source/drain region) defined along their length in the X-direction, where the at least one channel region is covered by gate structures and is disposed between the source/drain regions. In some embodiments, fins 204 are portions of substrate 202 (such as a portion of a material layer of substrate 202). For example, in the depicted embodiment, where substrate 202 includes silicon, fins 204 include silicon. Alternatively, in some embodiments, fins 204 are defined in a material layer, such as one or more semiconductor material layers, overlying substrate 202. For example, fins 204 can include a semiconductor layer stack having various semiconductor layers (such as a heterostructure) disposed over substrate 202. The semiconductor layers can include any suitable semiconductor materials, such as silicon, germanium, silicon germanium, other suitable semiconductor materials, or combinations thereof. The semiconductor layers can include same or different materials, etching rates, constituent atomic percentages, constituent weight percentages, thicknesses, and/or configurations depending on the design requirement of device 200. Fins 204 are formed by any suitable process including various deposition, photolithography, and/or etching processes.

Isolation structure 208 is formed over substrate 202 and separates the lower portions of fins 204. Isolation structure 208 electrically isolates active device regions and/or passive device regions of device 200. Isolation structure 208 can be configured as different structures, such as a shallow trench isolation (STI) structure, a deep trench isolation (DTI) structure, a local oxidation of silicon (LOCOS) structure, or combinations thereof. Isolation structure 208 includes an isolation material, such as silicon oxide, silicon nitride, silicon oxynitride, other suitable isolation material, or combinations thereof. Isolation structure 208 is deposited by CVD, physical vapor deposition (PVD), atomic layer deposition (ALD), high density plasma CVD (HDPCVD), metal organic CVD (MOCVD), remote plasma CVD (RPCVD), PECVD, LPCVD, atomic layer CVD (ALCVD), atmospheric pressure CVD (APCVD), other suitable deposition process, or combinations thereof. In some embodiments, isolation structure 208 is formed before fins 204 are formed (an isolation-first scheme). In some other embodiments, fins 204 are formed before isolation structure 208 is formed (a fin-first scheme). A planarization process, such as a chemical mechanical polishing (CMP) process, can be performed on isolation structure 208.

In the depicted embodiment of FIG. 2, various gate structures 210 are formed over fins 204. Gate structures 210 extend along a Y-direction and traverse respective fin 204.

Gate structures 210 engage the respective channel regions of fins 204, such that current can flow between the respective S/D regions of fins 204 during operation. Each gate structure 210 may include a gate dielectric layer 216 and a gate electrode 212. Gate dielectric layer 216 may include a high-k dielectric material, which is a material having a dielectric constant that is greater than a dielectric constant of silicon dioxide ($SiO_2$), which is approximately 3.9. In alternative embodiments, the high-k gate dielectric may include ZrO2, Y2O3, La2O5, Gd2O5, TiO2, Ta2O5, HfErO, HfLaO, HfYO, HfGdO, HfAlO, HfZrO, HfTiO, HfTaO, or SrTiO. Gate electrode 212 may include a metal-containing material. In some embodiments, the metal gate electrode 212 may include a work function metal component and a fill metal component. The work functional metal component is configured to tune a work function of its corresponding FET to achieve a desired threshold voltage Vt. In various embodiments, the work function metal component may contain TiAl, TiAlN, TaCN, TiN, WN, W, other suitable material, or combinations thereof. The fill metal component is configured to serve as the main conductive portion of the functional gate structure. In various embodiments, the fill metal component may contain Aluminum (Al), Tungsten (W), Copper (Cu), or combinations thereof.

Spacers 214 are disposed along the sidewalls of gate electrode 212 and/or gate dielectric layer 216. Spacers 214 may comprise various layers, for example, one or more dielectric layers and pattern layers. In some embodiments, a dielectric layer is formed conformally over substrate 202. A pattern layer is formed conformally over the dielectric layer. The dielectric layer may include any suitable dielectric material, such as silicon, oxygen, carbon, nitrogen, other suitable material, or combinations thereof (for example, silicon oxide (SiO), silicon nitride (SiN), silicon oxynitride (SiON), or silicon carbide (SiC), low K (K<3.9) dielectric), and may be formed by any suitable method, such as ALD, CVD, PVD, other suitable methods, or combinations thereof. The pattern layer may include any suitable material that has a different etch rate than the dielectric layer, such as silicon nitride (SiN), silicon oxycarbonitride (SiOCN), other suitable dielectric materials, or combinations thereof. The pattern layer is deposited by any suitable method, such as ALD, to any suitable thickness. Subsequently, top portions of the dielectric layer and the pattern layer are removed by an etching process or any other suitable process. The etching process may be a dry etching process, a wet etching process, a reactive ion etching (RIE) process, or combinations thereof. The remaining portions of the dielectric layer and the pattern layer along the sidewalls of gate electrode 212 and/or the gate dielectric layer 216 form gate spacers 214. In some embodiments, a thickness along the X-direction of each layer of gate spacers 214 is about 1 nanometer (nm) to about 5 nm.

In some embodiments, gate structures 210 are formed by a gate replacement process after other components (for example, epitaxial S/D features 250 and ILD layer 270) of device 200 are fabricated. In a gate replacement process, dummy gate structures are formed to wrap the channel regions of respective fins 204. Each dummy gate structure may include a dummy gate electrode comprising polysilicon (or poly) and various other layers, for example, a hard mask layer disposed over dummy gate electrode, and an interfacial layer disposed over fins 204 and substrate 202, and below the dummy gate electrode. Spacers 214 are then formed along sidewalls of the dummy gate structure by any suitable method that aforementioned. After the formation of epitaxial S/D features 250 as well as ILD layer 270, dummy gate structures are removed along spacers 214 using one or more etching processes (such as wet etching, dry etching, RIE, or other etching techniques), therefore leaving openings over the channel regions of fins 204 in place of the removed dummy gate structures. The opening is then filled with a dielectric material to form dielectric layer 216 by various processes, such as ALD, CVD, PVD, and/or other suitable process. Metal gate materials are then deposited over dielectric layer 216 to form metal gate electrodes 212 of gate structures 210. Gate electrodes 212 are formed by various deposition processes, such as ALD, CVD, PVD, and/or other suitable process. A CMP process can be performed to remove any excess material of gate dielectric layer 216, gate electrodes 212, and/or spacers 214 to planarize gate structures 210.

Figure 3:
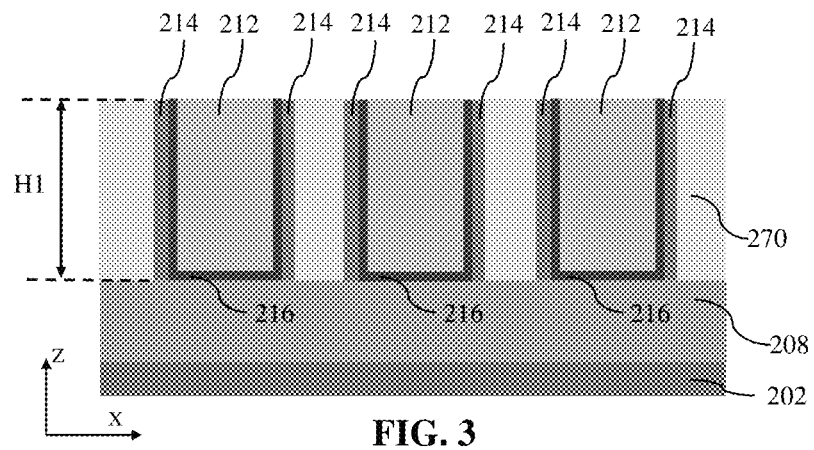
FIGS. 3-11 illustrate cross-sectional views along plane A-A shown in FIG. 2 of the example semiconductor device at intermediate stages of the method of FIG. 1 in accordance with some embodiments of the present disclosure.

FIG. 3 illustrate a cross-sectional view along plane A-A shown in FIG. 2 of semiconductor device 200 (that is, along the X-direction). In some embodiments, a height H1 of gate structures 210 along a Z-direction is about 10 nm to about 60 nm.

Still referring to FIG. 2, device 200 also includes epitaxial S/D features 250 formed in the source/drain regions of fins 204. For example, semiconductor material (such as silicon germanium (SiGe), silicon phosphide (SiP) or silicon carbide (SiC)) is epitaxially grown on fins 204, forming epitaxial S/D features 250 on fins 204. In furtherance of some embodiments, epitaxial source/drain features 250 extend (grow) laterally along the Y-direction, such that epitaxial source/drain features 250 are merged epitaxial source/drain features that span more than one fin. In some embodiments, epitaxial source/drain features 250 include partially merged portions and/or fully merged portions. An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous and/or liquid precursors, which interact with the composition of fins 204. In some embodiments, epitaxial source/drain features 250 are doped with n-type dopants and/or p-type dopants depending on a type of FET fabricated in their respective FET device region. In some embodiments, epitaxial source/drain features 250 include materials and/or dopants that achieve desired tensile stress and/or compressive stress in the channel regions. In some embodiments, epitaxial source/drain features 250 are doped during deposition by adding impurities to a source material of the epitaxy process. In some embodiments, epitaxial source/drain features 250 are doped by an ion implantation process subsequent to a deposition process. In some embodiments, annealing processes are performed to activate dopants in epitaxial source/drain features 250 of device 200.

Still referring to FIGS. 2 and 3, device 200 comprises an interlayer dielectric (ILD) layer 270 formed over substrate 202, including isolation structure 208 and S/D features 250, and between gate structures 210. ILD layer 270 includes a dielectric material including, for example, silicon oxide (SiO), silicon nitride (SiN), silicon oxynitride (SiON), tetraethylorthosilicate (TEOS) formed oxide, un-doped silicate glass, or doped silicon oxide such as borophosphosilicate glass (BPSG), fused silica glass (FSG), phosphosilicate glass (PSG), boron doped silicon glass (BSG), low-k dielectric material, other suitable dielectric material, or combinations thereof. In some embodiments, ILD layer 270 has a multilayer structure having multiple dielectric materials. In some embodiments, an ILD layer 270 may be formed by a deposition process (such as CVD, FCVD, PVD, ALD, HDPCVD, MOCVD, RPCVD, PECVD, LPCVD, ALCVD, APCVD, plating, other suitable methods, or combinations thereof) to cover isolation structure 208, S/D features 250 and the dummy gate structures. Subsequent to the deposition of ILD layer 270, a CMP process and/or other planarization process may be performed to expose the dummy gate structures. Thereafter, the aforementioned metal gate replacement process may be implemented to replace the dummy gate structures with metal gate structures 210.

Figure 4:
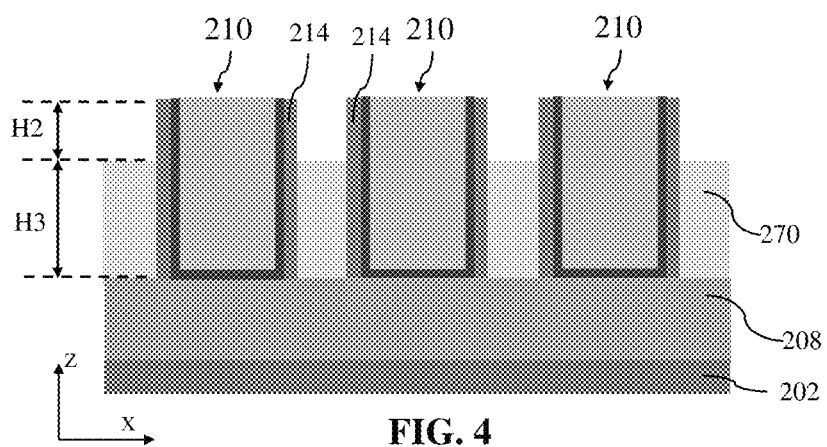

Now referring to FIGS. 1 and 4, at operation 104, ILD layer 270 is recessed to a depth of H2 such that a top surface of the recessed ILD layer 270 is below a top surface of gate structures 210. As depicted in FIG. 4, the recessed depth H2 is less than the gate height H1. In other words, a lower portion of ILD layer 270 with a height of H3 (equals to a difference between H1 and H2) is remained over substrate 202. In some embodiments, the recessed depth H2 is about 10% to about 50% of the gate height H1. Accordingly, the height H3 of the recessed ILD layer 270 along the Z-direction is about 50% to about 90% of the gate height H1. In some further embodiments, the recessed depth H2 is about 5 nm to about 20 nm. The height H3 of the recessed ILD layer 270 is about 10 nm to about 40 nm. ILD layer 270 can be recessed by any suitable process. In some embodiments, ILD layer 270 is recessed by an etching process, including a wet etch, a dry etch, other suitable etching process, or a combination thereof. For example, ILD layer 270 is recessed by a selective wet etching process, where only a top portion of ILD layer 270 is removed, spacers 214 along the sidewalls of ILD layer 270 are substantially unchanged. A time control is applied to control the extent of the etching, i.e. the recessed depth H2, according to the design requirement of device 200.

Figure 5:
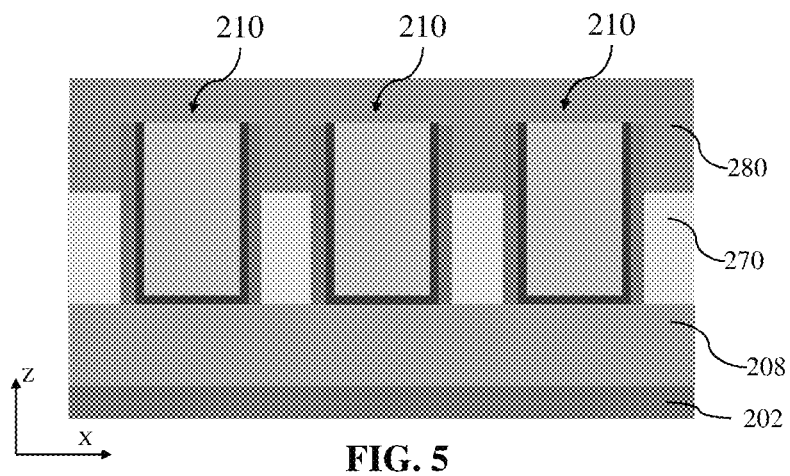

Now referring to FIGS. 1 and 5, at operation 106, a hard mask layer 280 is deposited over substrate 202, for example, over ILD layer 270, gate structures 210 and source/drain features 250. In some embodiments, hard mask layer 280 may include one or more layers of material such as silicon (Si), silicon carbide (SiC), silicon nitride (SiN), silicon oxycarbide (SiOC), silicon oxycarbonitride (SiOCN), other suitable materials, or combinations thereof. In some embodiments, hard mask layer 280 is disposed by a deposition processes, such as ALD, CVD, PVD, and/or other suitable process. As depicted in FIG. 5, hard mask layer 280 is deposited to cover the recessed ILD layer 270 and gate structures 210.

Figure 6:
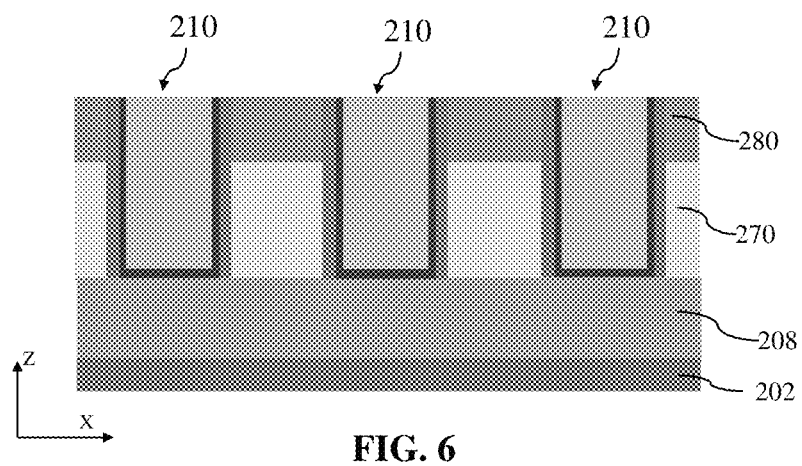

Referring to FIGS. 1 and 6, still at operation 106, a CMP process or other planarization process is performed to remove a top portion of hard mask layer 280 until reaching and exposing gate structures 210. In some embodiments, a top surfaces of hard mask layer 280 and a top surface of gate structures 210 are substantially co-planar after the planarization process.

Figure 7:
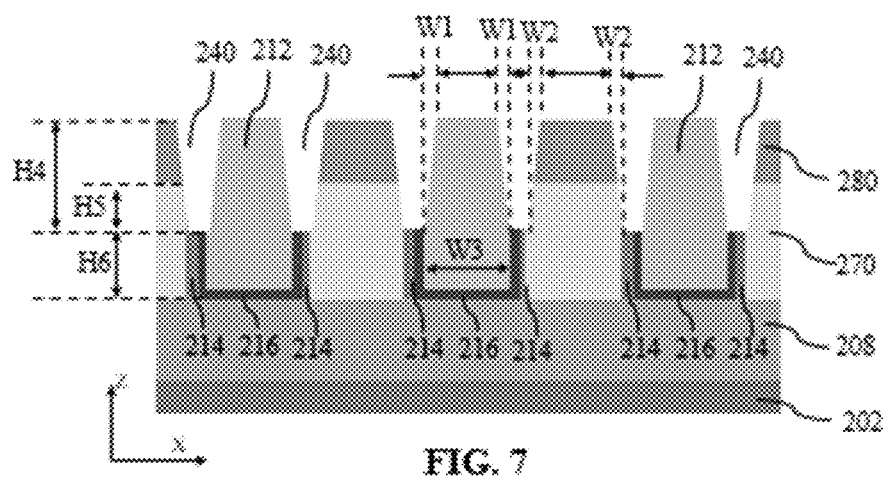

Now referring to FIGS. 1 and 7, at operation 108, top portions of spacers 214 are removed to form a trench 240 having a funnel shape, i.e. a top surface of the trench 240 is larger than a bottom surface of the trench 240. After removing of the top portions of spacers 214, a top surface of the recessed spacers 214 (the remained bottom portions of spacers 214) is below a top surface of the recessed ILD layer 270. In some embodiments, operation 108 only removes the top portions of spacers 214, and gate dielectric layers 216 are substantially unchanged. In some other embodiments, as depicted in FIG. 7, not only the top portions of spacers 214 are removed, but also a top portions of gate dielectric layers 216 are removed at operation 108. Thus, a top surface of gate dielectric layers 216 is below a top surface of the recessed ILD layer 270 and a height of gate dielectric layers 216 is substantially equal to the height of the recessed spacers 214. In some embodiments, spacers 214 are recessed to a depth H4, for example, about 5 nm to about 25 nm. In some further embodiments, each of the recessed spacers 214 (the remained bottom portions of spacers 214) has a height H6, and a top surface of the recessed spacer 214 is lower than a top surface of the recessed ILD layer 270 for a height difference H5. In other words, the height difference H5 plus the height H6 of the recessed spacers 214 equals to the height H3 of the recessed ILD layer 270. In some embodiments, the height difference H5 is about 20% to about 50% of the height H3 of the recessed ILD layer 270. That is to say, the height H6 of the recessed spacers 214 is about 50% to about 80% of the height H3 of the recessed ILD layer 270. In some further embodiments, the height difference H5 between the top surface of the recessed spacers 214 and the top surface of the recessed ILD layer 270 is about 3 nm to about 10 nm.

In some embodiments, at operation 108, the top portions of gate electrodes 212 are also laterally removed at operation 108 to form tilting sidewalls of the top portions of gate electrodes 212. As depicted in FIG. 7, a top surface of each side of the top portion of gate electrode 212 is laterally removed for an extent of W1. The lateral removing extent becomes smaller going down along the sidewall of gate electrode 212 (tapered inward), and the lateral removing stops at the top surface of the recessed spacers 214. In some embodiments, the lateral removing extent turns to substantially zero at the top surface of the recessed spacers 214. Therefore, the top portion of gate electrode 212 has a tilted sidewall. In some further embodiments, at operation 108, portions of hard mask layer 280 and the recessed ILD layer 270 are also laterally removed. As depicted in FIG. 7, a top surface of each side of the hard mask layer 280 is laterally removed for an extent of W2. In some embodiments, the top surface of the hard mask layer 280 may be removed symmetrically to the top surface of the gate electrode 212, i.e. W2 equals to W1. In some other embodiment, the top surface of the hard mask layer 280 may be removed asymmetrically to the top surface of gate electrode 212, i.e. W2 is larger or smaller than W1. The etching extents of W1 and W2 are related with the materials of gate electrode 212 and hard mask layer 280. Different materials may have different etching rate, which may cause different etching extents. Similarly, the extent of the laterally removing of hard mask layers 280 becomes smaller going down along the sidewalls of hard mask layers 280 as well as the sidewalls of recessed ILD layer 270 (tapered inward), and the laterally removing stops at the top surface of the recessed spacers 214. In some embodiments, the lateral removing extent turns to substantially zero at the top surface of the recessed spacers 214. Therefore, hard mask layer 280 and a portion of the recessed ILD layer 270 above the recessed spacer 214 have tilted sidewalls, symmetric or asymmetric (depending on the design requirement and fabrication process of device 200) with the tilted sidewalls of gate electrode 212. In the depicted embodiment of FIG. 7, the tilted sidewall of gate electrode 212 is symmetric with the tilted sidewall of hard mask layer 280 and the recessed ILD layer 270. In some embodiments, a width W3 in the X-direction of gate electrode 212 is about 10 nm to about 30 nm, the lateral removing extent W1 of each side of the top surface of gate electrode 212 or hard mask layer 280 is about 1 nm to about 3 nm. In some further embodiments, and the lateral removing extent W1 is about 10% to about 20% of the width W3 of the gate electrode. After the removing of the top portions of spacers 214 and laterally removing of the side portions of gate electrode 212, hard mask layer 280 and the recessed ILD layer 270, trench 240 is formed by the top surface of the recessed spacers 214 and the tilted sidewalls of gate electrode 212, hard mask layer 280 and the recessed ILD layer 270, as depicted in FIG. 7. Trench 240 has a funnel shape, where a top surface of trench 240 is larger than a bottom surface of trench 240. And gate electrode 212 has a tapered profile in the portion above the recessed spacer 214 (the top portion of gate electrode 212), wherein the top surface of the top portion of gate electrode 212 is smaller than the bottom surface of the top portion of gate electrode 212, which is substantially equal to the bottom surface of gate electrode 212.

In some embodiments, top portions of spacers 214, gate electrodes 212, hard mask layer 280 and the recessed ILD layer 270 are removed by a suitable etching process, such as dry etch, wet etch, other suitable etching process, or combinations thereof. In some embodiments, the etching process comprises multiple steps. For example, in a first step, a reactive ion etching (RIE) is implemented to the top surface of spacers 214, as well as portions of gate electrodes 212 and hard mask layer 280. During the RIE, a chemical reaction is applied to weaken the bonding of the top portion of the material of spacers 214, as well as the materials of gate electrodes 212 and hard mask layer 280. Weakening the bonding of the materials may assist the following etching process. In some embodiments, a plasma (for example, an argon-based plasma) maybe bombard by a power of about 10 watts (W) to about 300 W to release argon ions. The argon ions may react with the top portions of spacers 214 as well as side portions of gate electrodes 212, hard mask layer 280 and ILD layer 270, such that the top portions of spacers 214 and side portions of gate electrodes 212, hard mask layer 280 and ILD layer 270 are damaged. In a second step, a dry etching process may be applied to taper inward from the top surface of the damaged portion of spacers 214, gate electrode 212 and hard mask layer 280, and form the funnel shape trench 240 above the recessed spacers 214 (the remained bottom portion of spacers 214). In some embodiments, the dry etching is applied using hydrogen fluoride (HF) or nitrogen trifluoride (NH3) as the chemical gas, with an electrode power of about 10 W to about 200 W, and under a gas pressure of about 50 Pa (100 mTorr) to about 200 Pa. In some embodiments, the dry etching may be applied at a temperature of room temperature to about 200° C. The etching depth H4 is controlled by time, such that the funnel shape trench 240 according to the design requirement of device 200 can be achieved by the etching process as mentioned above.

Figure 8:
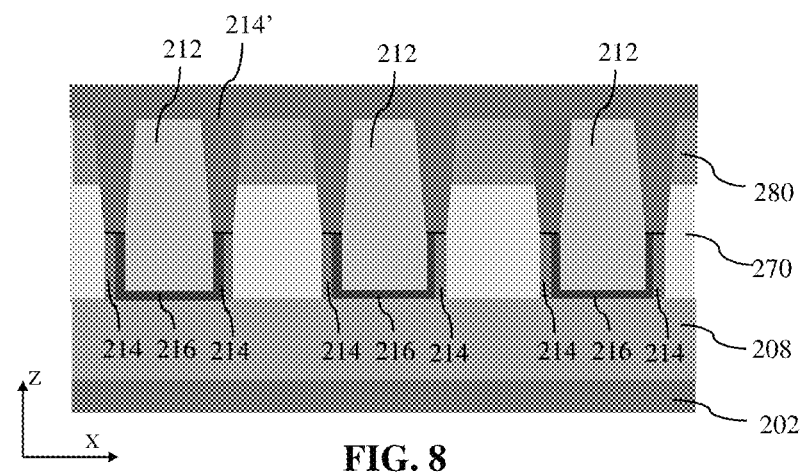

Now referring to FIGS. 1 and 8, at operation 110, a spacer refill portion 214' is disposed over substrate 202 and in the funnel shape trench 240. As depicted in FIG. 8, spacer refill portion 214' is disposed over the recessed spacer 214, recessed gate dielectric layer 216, taper gate electrode 212, taper hard mask layer 280, and taper ILD layer 270. In some embodiments, spacer refill portion 214' may include one or more layers of material such as silicon carbide (SiC), silicon nitride (SiN), silicon oxycarbide (SiOC), silicon oxycarbonitride (SiOCN), other suitable materials, or combinations thereof. In some embodiments, spacer refill portion 214' may include the same material as hard mask layer 280. In some embodiments, spacer refill portion 214' may include a material having different etching selectivity than the material of ILD layer 270, such that during the following fabrication of S/D contact 290, even if the contact opening pattern is shifted, only ILD layer 270 will be removed, and spacer refill portion 214' will be substantially unaffected to provide a safe space between gate electrode 212 and S/D contact 290. Spacer refill portion 214' may be formed by any suitable deposition method, such as ALD, CVD, PVD, other suitable method, or combinations thereof.

Figure 9:
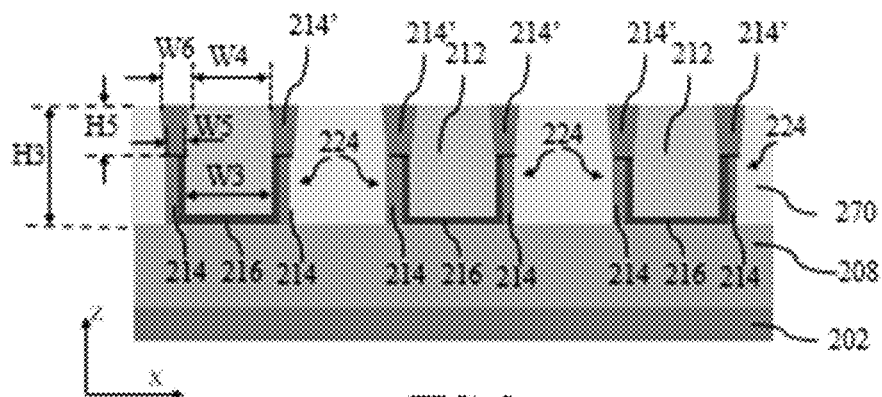

Now referring to FIGS. 1 and 9, still at operation 110, a planarization process, such as a CMP, is implemented to planarize the top surface of device 200. The planarization process removes the top portion of spacer refill portion 214', hard mask layer 280, and a top portion of gate electrode 212 (over the recessed ILD layer 270), until the recessed ILD layer 270 is exposed. The remained spacer refill portion 214' and the recessed spacer 214 are refer to a refilled spacer structure 224. As depicted in FIG. 9, a height of the remained portion of gate electrode 212 substantially equals to the height H3 of the recessed ILD layer 270. In some embodiments, the height H3 of the recessed ILD layer 270 is about 10 nm to about 40 nm. A height H5 of the remained spacer refill portion 214' is about 3 nm to about 10 nm, which is about 20% to about 50% of the height H3 of the refilled spacer structure 224 (including the spacer refill portion 214' and the recessed spacer 214). As depicted in FIG. 9, the top portion of gate electrode 212 has a taper profile, i.e. a top surface of the gate electrode 212 is smaller than a bottom surface of gate electrode 212. In some embodiments, a width W3 of the bottom surface (bottom width W3) of the gate electrode 212 is about 10 nm to about 30 nm; and a width W4 of the top surface (top width W4) of the gate electrode 212 is about 8 nm to about 26 nm, which is about 80% to about 90% of the bottom width W3 of the gate electrode 212. Meanwhile, spacer refill portion 214' (the top portion of refilled spacer structure 224) has a funnel profile, i.e. a top surface of spacer refill portion 214' is larger than a bottom surface of spacer refill portion 214'. The taper profile of gate electrode 212 and the funnel profile of spacer refill portion 214' can enlarge the space between the metal gate and the later formed S/D contact, especially at the top surface, compared with the conventional semiconductor device structure. Therefore, current leakage caused by the short path between the metal gate and the S/D contact may be mitigated and the performance of the semiconductor device may be improved. In some embodiments, a width W5 of the bottom surface (bottom width W5) of the spacer refill portion 214' is about 2 nm to about 8 nm, and a width W6 of the top surface (top width W6) of the spacer refill portion 214' is about 3 nm to about 14 nm, which is about 1.5 times to about 2 times of the bottom width W5 of the spacer refill portion 214'.

Figure 10:
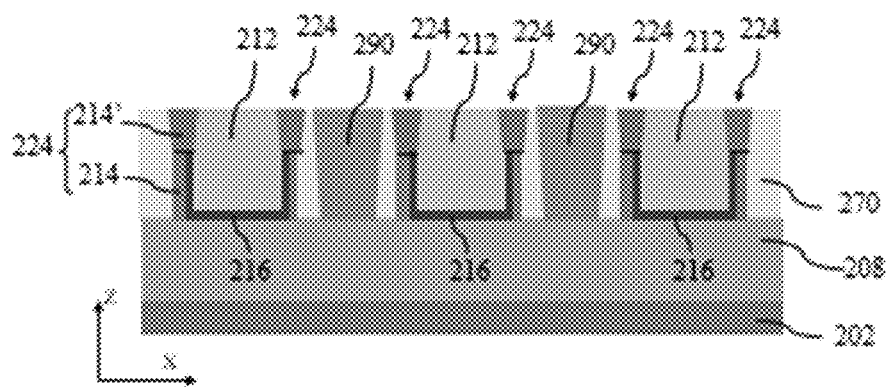

Now referring to FIGS. 1 and 10, at operation 112, source/drain (S/D) contacts 290 are formed in the source/drain regions of device 200. S/D contacts 290 may include any suitable electrically conductive material, such as Ta, Ti, Al, Cu, Co, W, TiN, TaN, other suitable conductive materials, or combinations thereof. Various conductive materials can be combined to provide S/D contacts 290 with various layers, such as one or more barrier layers, adhesion layers, liner layers, bulk layers, other suitable layers, or combinations thereof.

Forming of S/D contacts 290 may comprise multiple processes including various photolithography, etching, and/or deposition processes. In some embodiments, portions of ILD layer 270 may be removed to form contact openings for the deposition of S/D contacts 290. For example, first, a photolithography process is performed. The photolithography process may include forming a photoresist layer (resist) overlying device 200, exposing the resist to a pattern, performing a post-exposure bake process, and developing the resist to form a masking element including the resist. The masking element is then used to etch ILD layer 270 to form the contact openings. A selective etching process is then performed to remove portions of ILD layer 270 in the contact openings. The etching process can include a dry etching process (for example, a reactive ion etching (RIE) process), a wet etching process, other suitable etching process, or combinations thereof. Because the materials of refilled spacer structure 224 (including the recessed spacers 214 and spacer refill portion 214') have different etching selectivity than the material of ILD layer 270, even the masking element to form the contact openings shifts during the fabrication, only portions of ILD layer 270 are removed, refilled spacer structure 224 (including the recessed spacers 214 and spacer refill portion 214') are substantially unchanged. In some embodiments, ILD layer 270 are tapered inward in the contact openings going down along the sidewalls of ILD layer 270. The patterned resist layer can be removed before or after the etching process. In some embodiments, the exposure process can implement maskless lithography, electron-beam writing, ion-beam writing and/or nanoprint technology.

Alternatively or additionally, the contact openings are formed by a selective etching process, where ILD layer 270 is substantially completely removed, and refilled spacer structures 224 (including the recessed spacers 214 and spacer refill portion 214') are substantially unaffected due to the different etching selectivity.

Subsequently, metal materials are filled in the contact openings to form S/D contacts 290. S/D contacts 290 are formed by filling the contact openings with one or more conductive materials. The conductive material(s) can be deposited by PVD, CVD, ALD, electroplating, electroless plating, other suitable deposition process, or combinations thereof. In some embodiments, S/D contacts 290 fill in the contact opening having a funnel shape. Accordingly, S/D contacts 290 have a funnel/tilting profile, wherein the top surface of S/D contact 290 is larger than a bottom surface of S/D contact 290. Thereafter, one or more polishing processes (for example, CMP) may be performed to remove any excess conductive materials and planarize the top surface of device 200.

As depicted in FIG. 10, the top portion of refilled spacer structure 224 (i.e. spacer refill portion 214') has a funnel profile (a larger top surface and a smaller bottom surface), and the top portion of gate electrode 212 has a taper profile (a smaller top surface and a larger bottom surface). Compare with the conventional profiles of the spacer and the metal gate, i.e. substantially equal top and bottom surface areas (a rectangle shape in the X-Z plane), refilled spacer structure 224 and gate electrode 212 of the present disclosure can enlarge the distance between the metal gate (for example, gate electrode 212) and the S/D contacts (for example, S/D contacts 290), thus even though the S/D contacts may have a funnel/tilting profile and/or the mask element may be shifted during the fabrication of the S/D contacts, the short path issue between the metal gate and the S/D contacts may be mitigated. Thus, the current leakage may be reduced and the performance of the semiconductor device may be improved.

Figure 11:
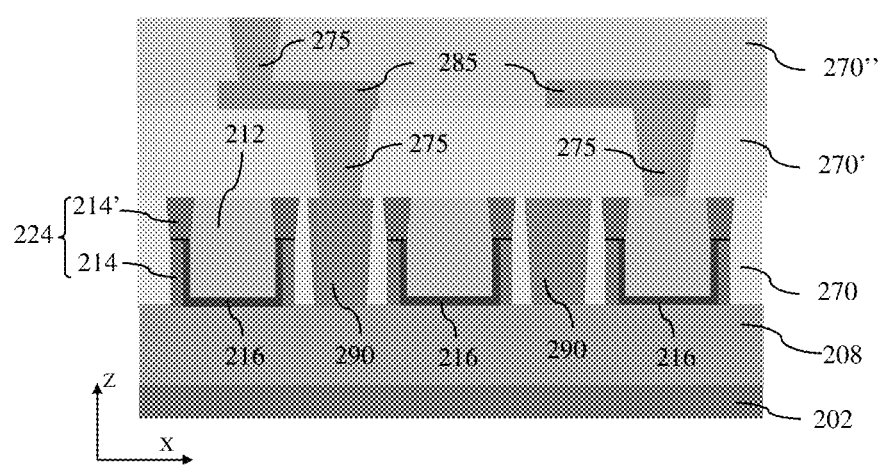

Referring to FIGS. 1 and 11, at operation 114, method 100 performs further processing to complete the fabrication of device 200. For example, as depicted in FIG. 11, a second ILD layer 270' is deposited over the substrate 202. An etch stop layer may be deposited before the deposition of the second ILD layer 270'. The deposition of the etch stop layer and the ILD layer 270' may include any proper deposition process and a CMP to planarize the top surface of the layer(s). A patterned photoresist mask is then formed over the ILD layer 270'. Subsequently, the second ILD layer 270' is etched through the photoresist mask to form the via cuts therein. After removing the photoresist mask, the via cuts formed in the second ILD layer 270' are filled up with conductive materials to form the S/D vias and/or gate vias (all referred to as vias 275). A material of the vias 275 may include any suitable conductive materials such as aluminum (Al), Copper (Cu), Tungsten (W), ruthenium (Ru), nickel (Ni), or combinations thereof. A barrier layer may be formed between vias 275 and the ILD layer 270'. A material of the barrier layer may include titanium nitride (TiN)/titanium (Ti), tantalum nitride (TaN)/tantalum (Ta), or combinations thereof. Thereafter, similar as the second ILD layer 270', a third ILD layer 270" may be deposited over the substrate 202. Similar as the formation of vias 275, metal wires 285 and other vias 275 may be formed within the third ILD layer 270". And, according to the design requirement of device 200, other ILD layers, metal wires, vias, and contacts may be formed over the substrate. The various contacts, vias, wires, and multilayer interconnect features (e.g., metal layers and interlayer dielectrics) over device 200 are configured to connect the various features to form a functional circuit that may include one or more multi-gate devices. In the depicted embodiment, because of the spacer refill portion 214', the distance between the S/D vias and the gate electrode is also enlarged, thus the leakage issues cause by the photoresist mask shifting (overlay shifting) may be mitigated and the device performance may be improved.

Although not intended to be limiting, one or more embodiments of the present disclosure provide many benefits to a semiconductor device and a formation process thereof. For example, embodiments of the present disclosure provide a semiconductor device includes a spacer having a funnel shaped top portion and a metal gate electrode having a tapered top portion. The funnel profile of the spacer and the tapered profile of the metal gate enlarges the space between the S/D contact and the metal gate. Thus, the current leakage issue due to the short path between the S/D contact and the gate electrode may be mitigated and the performance of the semiconductor device may be improved.

The present disclosure provides for many different embodiments. Semiconductor device having funnel shape spacers and methods of fabrication thereof are disclosed herein. An exemplary semiconductor device includes a substrate and at least two gate structures disposed over the substrate. Each of the at least two gate structures includes a gate electrode and a spacer disposed along sidewalls of the gate electrode. The spacer includes a refill portion and a bottom portion, wherein the refill portion of the spacer has a funnel shape such that a top surface of the refill portion of the spacer is larger than a bottom surface of the refill portion of the spacer. The semiconductor device further includes a source/drain contact disposed over the substrate and between the spacers of the at least two gate structures.

In some embodiments, the gate electrode of each of the at least two gate structures includes a top portion and a bottom portion, wherein the top portion of the gate electrode has a taper shape such that a top surface of the top portion of the gate electrode is smaller than a bottom surface of the top portion of the gate electrode.

In some embodiments, a height of the spacer including the refill portion and the bottom portion is about 10 nm to about 40 nm, and a height of the refill portion of the spacer is about 3 nm to about 10 nm.

In some embodiments, a ratio of a height of the refill portion of the spacer to a height of the spacer is about 20% to about 50%.

In some embodiments, a material of the refill portion of the spacer is selected from silicon carbide (SiO), silicon nitride (SiN), silicon oxycarbide (SiOC), silicon oxycarbonitride (SiOCN), or a combination thereof.

In some embodiments, the semiconductor device further includes an interlayer dielectric (ILD) layer disposed between the spacer and the source/drain contact. And, a material of the refill portion of the spacer is different than a material of the ILD layer.

In some embodiments, a material of the refill portion of the spacer is different than a material of the bottom portion of the spacer.

Another semiconductor device includes a substrate and an isolation layer disposed over the substrate. The semiconductor device also includes a gate structure disposed over the isolation layer. The gate structure includes a gate electrode and a spacer disposed along a sidewall of the gate electrode. A top surface of the gate electrode is smaller than a bottom surface of the gate electrode. The spacer of the gate structures comprises a top portion and a bottom portion and a top surface of the top portion of the spacer is larger than a bottom surface of the top portion of the spacer.

In some embodiments, the semiconductor device further includes a source/drain contact having a top surface larger than a bottom surface, and the spacer is disposed between the gate electrode and the source/drain contact.

In some embodiments, the gate structure further includes a gate dielectric layer including a bottom portion disposed between the gate electrode and the isolation layer and a sidewall portion disposed between the gate electrode and the spacer. A height of the sidewall portion of the gate dielectric layer is less than a height of the gate structure and is substantially equal to a height of the bottom portion of the spacer.

An exemplary method includes forming at least two gate structures over a substrate, wherein each of the at least two gate structures includes a gate electrode and a spacer along a sidewall of the gate electrode. The method also includes forming an interlayer dielectric (ILD) layer over the substrate and between the at least two gate structures; etching a top portion of each of the spacers of the at least two gate structures to form a trench between the gate electrode and the ILD layer, wherein the trench includes a bottom surface lower than the top surface of the ILD layer and a tilted sidewall such that a top surface of the trench is larger than a bottom surface of the trench; and filling the trench to form a refill portion of the spacer.

In some embodiments, the method further includes etching the ILD layer between the spacers of the at least two gate structures to form a contact opening; and forming a S/D contact in the contact opening.

In some embodiments, filling the trench to form the refill portion of the spacer includes filling the trench with a material having a different etching selectivity than a material of the ILD layer.

In some embodiments, the method further includes etching the ILD layer to form a recessed ILD layer such that a top surface of the recessed ILD layer is lower than a top surface of the at least two gate structures; forming a hard mask layer over the recessed ILD layer; and wherein etching a top portion of each of the spacers includes laterally etching a portion of the hard mask layer, a portion of the recessed ILD layer, and a portion of the gate electrode to form the tiled sidewall of the trench; and the bottom surface of the trench is lower than the top surface of the recessed ILD layer.

In some embodiments, etching the ILD layer to form the recessed ILD layer includes etching the ILD layer such that the recessed ILD layer having a height of about 50% to about 90% of the at least two gate structures.

In some embodiments, an extent of the laterally etching to a top surface of the gate electrode is about 10% to about 20% of a width of the gate electrode.

In some embodiments, filling the trench to form a refill portion of the spacer includes filling the trench with a material same as a material of the hard mask layer to form the refill portion of the spacer.

In some embodiments, etching a top portion of each of the spacers to form a trench includes bombarding a top surface of the spacer with an argon-based gas; and dry etching the top portion of the spacer to form the trench.

In some embodiments, the top surface of the spacer is bombarded by the argon-based gas at a power of about 10 watts to about 300 watts, and the dry etching is applied using hydrogen fluoride (HF) or nitrogen trifluoride (NH3) with an electrode power of about 10 watts to about 200 watts, under a gas pressure of about 50 Pa to about 200 Pa and at a temperature of room temperature to about 200° C.

In some embodiments, etching a top portion of each of the spacers to form a trench includes etching the top portion of the spacer such that the bottom surface of the trench is lower than the top surface of the ILD layer for about 3 nm to about 10 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
 a gate stack disposed over a substrate, the gate stack including a gate dielectric layer and a gate electrode layer, the gate dielectric layer having a sidewall and a top surface, the top surface facing away from the substrate;
 a first sidewall spacer disposed along and interfacing with the sidewall of the gate dielectric layer, the first sidewall spacer having a top surface facing away from the substrate;
 a second sidewall spacer disposed along and interfacing with a sidewall of the gate electrode layer, the top surface of the first sidewall spacer and the top surface of the gate dielectric layer wherein a lower portion of the second sidewall spacer has a first width and an upper portion of the second sidewall spacer has a second width that is different than the first width; and
 an interlayer dielectric layer disposed on the substrate and interfacing with the first sidewall spacer and the second sidewall spacer, the interlayer dielectric layer having a top surface that is substantially coplanar with a top surface of the second sidewall spacer, the respective top surfaces of the interlayer dielectric layer and the second sidewall spacer facing away from the substrate.

2. The device of claim 1, wherein the width of the gate electrode layer increases in the direction of the substrate.

3. The device of claim 1, wherein the sidewall of the gate electrode layer is a first tapered sidewall portion of the gate electrode layer,
wherein the gate electrode layer further includes a second tapered sidewall portion that opposes the first tapered sidewall portion of the gate electrode layer.

4. The device of claim 1, further comprising:
a contact feature disposed in the interlayer dielectric layer, and
wherein the contact feature and the first sidewall spacer are spaced apart a first distance by the interlayer dielectric layer, the first distance being measured in a first direction that is parallel to a top surface of the substrate, and
wherein the contact feature and the second sidewall spacer are spaced apart a second distance by the interlayer dielectric layer, the second distance being measured in the first direction.

5. The device of claim 1, further comprising:
a contact feature disposed in the interlayer dielectric layer such that a portion of the interlayer dielectric layer extends from the contact feature to the second sidewall spacer, and
wherein the portion of the interlayer dielectric layer has variable width.

6. The device of claim 5, wherein the gate electrode layer extends to at least the same height over the substrate as the portion of the interlayer dielectric layer.

7. The device of claim 1, wherein the first sidewall spacer has a substantially constant width.

8. The device of claim 1, wherein the second sidewall spacer has a funnel-shaped cross-sectional profile.

9. The device of claim 1, wherein the gate electrode layer has a top surface is substantially coplanar with the top surface of the interlayer dielectric layer, the top surface of the gate electrode layer facing away from the substrate.

10. A device comprising:
a gate stack disposed over a substrate, the gate stack including a gate dielectric layer extending to a first height over the substrate and a gate electrode layer, the gate electrode layer having a top surface facing away from the substrate;
a first sidewall spacer disposed along and interfacing with the gate dielectric layer and extending to the first height above the substrate;
a second sidewall spacer disposed over and interfacing with the gate dielectric layer and the first sidewall spacer, the second sidewall spacer having a top surface extending to a second height above the substrate, the top surface of the second sidewall spacer facing away from the substrate, wherein the top surface of the gate electrode layer extends to the second height above the substrate; and
a third sidewall spacer disposed on and interfacing with the gate electrode layer, wherein a portion of the gate electrode layer extends from the third sidewall spacer to the second sidewall spacer, and wherein the portion of the gate electrode layer includes an upper portion having a first width and a lower portion having a second width that is different than the first width.

11. The device of claim 10, wherein the second width is wider than the first width.

12. The device of claim 10, wherein the second sidewall spacer and the third sidewall spacer each have a funnel-shaped cross-sectional profile.

13. The device of claim 10, wherein the second sidewall spacer has opposing sidewall surfaces that are non-parallel with respect to each other.

14. The device of claim 10, further comprising an interlayer dielectric layer disposed on the substrate, the interlayer dielectric layer having a top surface that is substantially coplanar with a top surface of the gate electrode layer.

15. The device of claim 10, further comprising:
a dielectric layer disposed on the substrate such that the gate stack, the first sidewall spacer and the second sidewall spacer are at least partially disposed within the dielectric layer, and
a contact extending through the dielectric layer, wherein respective top surfaces of the dielectric layer, second sidewall spacer and gate electrode layer form a planarized top surface.

16. A method comprising:
forming a gate structure over a fin structure, the gate structure including:
a gate dielectric layer;
a gate electrode disposed on the gate dielectric layer; and
a first sidewall spacer;
recessing the first sidewall spacer and the gate dielectric layer to expose a sidewall of the gate electrode;
forming a second sidewall spacer directly on the recessed first sidewall spacer, the recessed gate dielectric layer and the gate electrode;
forming an interlayer dielectric layer over the substrate, the gate structure being at least partially disposed within the interlayer dielectric layer; and
forming a hard mask layer on the interlayer dielectric layer and the gate structure; and
recessing the hard mask layer to expose a portion of the gate structure.

17. The method of claim 16, wherein the recessing of the first sidewall spacer and the gate dielectric layer to expose the sidewall of the gate electrode further includes removing a portion of the recessed hard mask layer.

18. The method of claim 16, wherein the gate electrode has a top surface facing away from the substrate and a sidewall surface extending therefrom, and
wherein the forming of the second sidewall spacer directly on the recessed first sidewall spacer, the recessed gate dielectric layer and the gate electrode includes:
forming a dielectric material layer directly on the recessed first sidewall spacer, the recessed gate dielectric layer, the top surface of the gate electrode and the sidewall surface of the gate electrode; and
removing portions of the dielectric material form the top surface of the gate electrode to thereby form the second sidewall spacer.

19. The method of claim 16, wherein the second sidewall spacer has a funnel-shaped cross-sectional profile after the forming of the second sidewall spacer directly on the recessed first sidewall spacer, the recessed gate dielectric layer and the gate electrode.

20. The method of claim 16, further comprising recessing the interlayer dielectric layer to expose a sidewall of the first sidewall spacer, and
wherein the forming of the hard mask layer on the interlayer dielectric layer and the gate structure includes forming the hard mask layer directly on the recessed interlayer dielectric layer and the sidewall of the first sidewall spacer.

* * * * *